United States Patent
Göötz et al.

(10) Patent No.: US 10,586,827 B2
(45) Date of Patent: Mar. 10, 2020

(54) OPTOELECTRONIC SEMICONDUCTOR COMPONENT AND METHOD FOR FABRICATING AN OPTOELECTRONIC SEMICONDUCTOR COMPONENT

(71) Applicant: OSRAM OLED GmbH, Regensburg (DE)

(72) Inventors: Britta Göötz, Regensburg (DE); Walter Wegleiter, Nittendorf (DE); Stefan Grötsch, Bad Abbach (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 193 days.

(21) Appl. No.: 15/533,025

(22) PCT Filed: Dec. 2, 2015

(86) PCT No.: PCT/EP2015/078403
§ 371 (c)(1),
(2) Date: Jun. 4, 2017

(87) PCT Pub. No.: WO2016/087542
PCT Pub. Date: Jun. 9, 2016

(65) Prior Publication Data
US 2018/0261648 A1    Sep. 13, 2018

(30) Foreign Application Priority Data

Dec. 4, 2014 (DE) .......... 10 2014 117 902
Mar. 3, 2015 (DE) .......... 10 2015 103 055

(51) Int. Cl.
*H01L 27/15* (2006.01)
*H01L 33/50* (2010.01)
(Continued)

(52) U.S. Cl.
CPC .......... *H01L 27/156* (2013.01); *H01L 25/167* (2013.01); *H01L 33/08* (2013.01);
(Continued)

(58) Field of Classification Search
None
See application file for complete search history.

(56) References Cited

U.S. PATENT DOCUMENTS

| 8,577,218 B2 | 11/2013 | von Malm et al. |
| 8,716,724 B2 | 5/2014 | von Malm et al. |

(Continued)

FOREIGN PATENT DOCUMENTS

| DE | 102009037186 A1 | 2/2011 |
| DE | 102009047788 A1 | 3/2011 |

(Continued)

*Primary Examiner* — Robert K Carpenter
(74) *Attorney, Agent, or Firm* — Slater Matsil, LLP (57) ABSTRACT

An optoelectronic semiconductor component is specified that has a semiconductor chip having a main side, the main side comprising a plurality of emission fields that are arranged next to one another. The emission fields are individually and independently actuatable and, during operation, they are each used to couple radiation out of the semiconductor chip. The main side has reflective partitions mounted on it that are arranged between adjacent emission fields and at least partially surround the emission fields in a plan view of the main side. In addition, the main side has a conversion element mounted on it, having an underside, which faces the semiconductor chip, and an averted top. The partitions are formed from a different material from the semiconductor material of the semiconductor chip and jut out from the semiconductor chip in a direction away from the main side. The conversion element covers at least one emission field at least partially and is connected to said emission field in a mechanically robust fashion. The underside of the conversion element in the region of the covered emission field juts (Continued)

out from the partitions in a direction away from the main side by no more than 10% of the height of the partitions.

15 Claims, 5 Drawing Sheets

(51) Int. Cl.
*H01L 33/60* (2010.01)
*H01L 33/08* (2010.01)
*H01L 33/38* (2010.01)
*H01L 25/16* (2006.01)

(52) U.S. Cl.
CPC .......... *H01L 33/382* (2013.01); *H01L 33/505* (2013.01); *H01L 33/60* (2013.01)

(56) References Cited

U.S. PATENT DOCUMENTS

| | | | |
|---|---|---|---|
| 8,742,433 B2 | 6/2014 | Ajiki et al. | |
| 9,012,926 B2 | 4/2015 | von Malm et al. | |
| 9,099,333 B2 | 8/2015 | Imamura et al. | |
| 9,343,636 B2 | 5/2016 | Ahlstedt | |
| 9,362,335 B2 | 6/2016 | von Malm | |
| 9,397,280 B2 | 7/2016 | Gootz et al. | |
| 9,559,266 B2 | 1/2017 | Wirth et al. | |
| 9,614,131 B2 | 4/2017 | Göötz et al. | |
| 9,799,805 B2 * | 10/2017 | Brandl | H01L 27/15 |
| 2012/0037885 A1 | 2/2012 | Schardt et al. | |
| 2012/0273807 A1 | 11/2012 | von Malm et al. | |
| 2015/0049502 A1 | 2/2015 | Brandl et al. | |
| 2015/0228870 A1 | 8/2015 | Goeoetz et al. | |
| 2015/0311407 A1 | 10/2015 | Göötz et al. | |
| 2016/0190110 A1 | 6/2016 | Göötz et al. | |

FOREIGN PATENT DOCUMENTS

| | | |
|---|---|---|
| DE | 102012101393 A1 | 8/2013 |
| DE | 102012101892 A1 | 9/2013 |
| DE | 102012102301 A1 | 9/2013 |
| DE | 102012107797 A1 | 2/2014 |
| DE | 102012112149 A1 | 6/2014 |
| DE | 102013207611 A1 | 10/2014 |
| JP | 2004273148 A | 9/2004 |
| JP | 2008177353 A | 7/2008 |
| JP | 2008294224 A | 12/2008 |
| JP | 2011060967 A | 3/2011 |
| JP | 2014165062 A | 9/2014 |
| WO | 2010072191 A1 | 7/2010 |
| WO | 2013092304 A1 | 6/2013 |
| WO | 2013131729 A1 | 9/2013 |

* cited by examiner

OPTOELECTRONIC SEMICONDUCTOR COMPONENT AND METHOD FOR FABRICATING AN OPTOELECTRONIC SEMICONDUCTOR COMPONENT

This patent application is a national phase filing under section 371 of PCT/EP2015/078403, filed Dec. 2, 2015, which claims the priority of German patent application 10 2014 117 902.1, filed Dec. 4, 2014 and German patent application 10 2015 103 055.1, filed Mar. 3, 2015, each of which is incorporated herein by reference in its entirety.

TECHNICAL FIELD

An optoelectronic semiconductor component is provided. A method for producing an optoelectronic semiconductor component is additionally provided.

SUMMARY OF THE INVENTION

Embodiments provide an optoelectronic semiconductor component in which the optical separation of adjacent emission fields or pixels is particularly effective. Further embodiments provide a method for producing such a semiconductor component.

According to at least one embodiment, the optoelectronic semiconductor component comprises a semiconductor chip with a major side. The major side preferably takes the form of a radiation exit face of the semiconductor chip. The major side in particular comprises a plurality of emission fields arranged adjacent one another which are individually and mutually independently drivable. If, for example, an emission field is driven or operated, radiation is coupled out from the semiconductor chip via this emission field, in particular over the entire lateral extent thereof parallel to the major side.

In plan view onto the major side, the emission fields in particular form individual pixels of the semiconductor chip. The emission fields may, for example, have cross-sectional shapes which, in plan view, are rectangular, such as square, or hexagonal or round.

The semiconductor chip preferably comprises a semiconductor layer sequence which is, for example, based on a III-V compound semiconductor material. The semiconductor material is, for example, a nitride compound semiconductor material such as $Al_n In_{1-n-m} Ga_m N$ or a phosphide compound semiconductor material such as $Al_n In_{1-n-m} Ga_m P$ or also an arsenide compound semiconductor material such as $Al_n In_{1-n-m} Ga_m As$, wherein in each case $0 \leq n \leq 1$, $0 \leq m \leq 1$ and $m+n \leq 1$ applies. The semiconductor layer sequence may comprise dopants and additional constituents. For simplicity's sake, however, only the essential constituents of the crystal lattice of the semiconductor layer sequence are indicated, i.e., Al, As, Ga, In, N or P, even if these may be partially replaced and/or supplemented by small quantities of further substances. The semiconductor layer sequence is preferably based on AlInGaN.

The semiconductor layer sequence comprises at least one active layer which is configured for generating electromagnetic radiation. The active layer in particular contains at least one pn-junction and/or at least one quantum well structure. Radiation generated by the active layer when in operation lies in particular in the region of the spectrum between 400 nm and 800 nm inclusive.

According to at least one embodiment, the optoelectronic semiconductor component comprises reflective partitions applied onto the major side. The partitions are here in particular arranged between adjacent emission fields and, viewed in plan view onto the major side, at least partially, in particular completely, surround the emission fields.

The partitions are preferably in direct contact with the major side. In this case, the partitions are fastened to the major side without an additional connecting means, such as adhesive, between the partitions and the major side.

The reflective partitions preferably bring about optical separation between an emission field which is in operation and an emission field adjacent thereto. In other words, for an observer at conventional distances of 10 cm from the semiconductor chip, two directly adjacent emission fields are sharply separated from one another. A driven emission field thus does not, or for an observer does not appreciably, cross-illuminate a directly adjacent, emission field which is not driven. Crosstalk between adjacent emission fields is thus reduced by the partitions.

The partitions are particularly preferably part of a reflective grid with meshes, for example, arranged adjacent one another in the manner of a matrix, wherein the reflective partitions form a reticulate grid around the meshes and wherein, in plan view onto the major side, each of the emission fields lies one-to-one in a mesh of the reflective grid. In particular, in plan view onto the major side, one or more of the emission fields are then completely surrounded by a contiguous and uninterrupted web of partitions.

According to at least one embodiment, at least one conversion element is applied onto the major side. The conversion element here comprises a bottom facing the semiconductor chip and a top remote from the semiconductor chip.

In operation, the conversion element partially or completely converts primary radiation from the semiconductor chip which impinges on the conversion element into secondary radiation of another wavelength. The semiconductor chip may, for example, emit blue light or UV light which is at least partially converted into red and/or green and/or yellow light by the conversion element. As a result of mixing the primary radiation and the secondary radiation emitted by the conversion element, the semiconductor component can emit mixed light, for example, white light, via the corresponding emission field.

The conversion element may, for example, comprise or consist of an inorganic luminescent material, such as yttrium aluminum garnet, YAG for short, and/or lutetium aluminum garnet, LuAG for short, and/or lutetium yttrium aluminum garnet, LuYAG for short, and/or other garnets provided with rare earths. The luminescent material may furthermore comprise or consist of an alkaline earth silicon nitride and/or an alkaline earth aluminum silicon nitride. Other nitrides and/or sulfides and/or silicates are also conceivable as a luminescent material. The conversion element may in particular comprise the above-stated luminescent materials in the form of particles which are embedded and distributed in a matrix material, for example, a silicone or epoxide. It is also possible for the conversion element to be a ceramic conversion element, which consists, for example, to an extent of at least 70% or at least 90% or completely of a luminescent material.

According to at least one embodiment, the partitions are formed from a material which differs from the semiconductor material of the semiconductor chip. In particular, the partitions are not part of the semiconductor layer sequence of the semiconductor chip, but rather are fabricated from another material and are only applied onto the semiconductor chip once the semiconductor chip is complete. The partitions may here be reflective or diffusely scattering for the light emitted by the semiconductor chip. In particular, the reflective partitions are non-transmissive in the direction parallel and/or perpendicular to the major side to the radiation emitted by the semiconductor chip and have a reflectivity for this radiation, for example, of at least 80% or 90% or 95%. The material of the partitions may be, for example, an epoxide or silicone which is provided with reflective particles, such as titanium dioxide particles, $TiO_2$ for short, and/or metal particles, such as silver or aluminum or gold, and/or barium titanium oxide particles, such as $BaTiO_3$, and/or yttrium boron oxide particles, such as $YBO_3$, and/or alkaline earth metal oxocarbon particles, such as $CaCO_3$ or $MgCO_3$, and/or ZnS and/or ZnO and/or $ZrO_2$ and/or $BaSO_4$.

According to at least one embodiment, the partitions project beyond the semiconductor chip in the direction away from the major side. The partitions may then, for example, have a height measured perpendicular to the major side of, for example, at least 3 µm or at least 5 µm or at least 10 µm. Alternatively or in addition, the height of the partitions is ≤20 µm or ≤15 µm or ≤10 µm. The maximum width of the partitions parallel to the major side amounts, for example, to at most 50 µm or at most 20 µm or at most 10 µm. Alternatively or in addition, the maximum width is ≥1 µm or ≥5 µm or ≥10 µm.

According to at least one embodiment, the conversion element covers at least one emission field and is mechanically stably connected to this emission field. In plan view onto the major side of the semiconductor chip, the conversion element may cover part of the associated emission field or the entire emission field. Mechanically stable means that, under the conventional forces or accelerations to which it is exposed in proper operation, the conversion element does not become detached from the corresponding emission field or change its position with regard to the emission field.

According to at least one embodiment, in the region of the covered emission field, the bottom of the conversion element projects beyond the partitions in a direction away from the major side by at most 10% or at most 5% or at most 1% of the height of the partitions. This is preferably the case over the entire region of the emission field. For example, in the region of the covered emission field, the bottom of the conversion element projects beyond the partitions by at most 1 µm or at most 500 nm or at most 100 nm or at most 50 nm.

Thus, if an equalization plane extending parallel to the major side of the semiconductor chip is laid through the highest partitions, i.e., on those points furthest away from the major side of the partitions surrounding the corresponding emission field, the distance of this equalization plane from the conversion element in the region of the emission field is at most the above-stated distance.

In at least one embodiment, the optoelectronic semiconductor component comprises a semiconductor chip with one major side, wherein the major side comprises a plurality of emission fields arranged adjacent one another. The emission fields are individually and mutually independently drivable. During operation, radiation is coupled out from the semiconductor chip in each case via the emission fields. Reflective partitions, which are arranged between adjacent emission fields and, in plan view onto the major side, at least partially surround the emission fields, are applied onto the major side. A conversion element having a bottom facing the semiconductor chip and a top remote from the semiconductor chip is furthermore applied onto the major side. The partitions are formed from a material which differs from the semiconductor material of the semiconductor chip and project beyond the semiconductor chip in the direction away from the major side. The conversion element at least partially covers at least one emission field and is mechanically stably connected to this emission field. In the region of the covered emission field, the bottom of the conversion element projects beyond the partitions in a direction away from the major side by at most 10% of the height of the partitions.

The present invention is based inter alia on the recognition that, in semiconductor chips with a plurality of separate emission fields, hereinafter also designated pixelated chips, the optical separation between individual pixels should be particularly significant. If it is additionally desired for the light emerging from the pixels to be converted, one possible solution is, for example, to cover all the pixels with a common conversion element. The conversion element may here be applied onto the semiconductor chip, for example, by means of an adhesive. It has, however, been found that crosstalk between adjacent pixels occurs just within the adhesive layer and the optical separation of adjacent pixels is therefore reduced.

In the present invention, a reflective grid of reflective partitions is applied onto the semiconductor chip, wherein the partitions partially surround the emission fields. In addition, care is taken to ensure that the applied conversion element projects only slightly beyond the partitions. In this manner, crosstalk between adjacent pixels, for example, through an adhesive layer, may be prevented. Optical separation between adjacent pixels is increased as a consequence.

According to at least one embodiment, the partitions and the conversion element are components of the semiconductor component which are applied one after the other onto the semiconductor chip. During production, it is preferred to apply the partitions first and then the conversion element onto the semiconductor chip. This is clear, for example, because the mechanical connection between the partitions and the semiconductor chip and the mechanical connection between the conversion element and the semiconductor chip are not produced by one and the same connecting means. In particular, the partitions may be applied to the major side without additional connecting means, while the conversion element may be fastened onto the major side of the semiconductor chip by means of an adhesive or likewise without additional connecting means. In particular, the major side thus does not comprise a contiguous bonding layer, such as an adhesive layer, which is arranged both beneath the partitions and beneath the conversion element.

According to at least one embodiment, the optoelectronic semiconductor component comprises a transparent adhesive which is applied at least onto one of the emission fields and at least partially form-fittingly covers side walls of the reflective partitions surrounding the emission field. The side walls are here sides of the partitions which extend transversely of or perpendicularly to the major side.

The transparent adhesive is thus at least partially bounded laterally by the partitions, is in direct contact with the partitions and conforms therewith, in particular with the side walls thereof. The partitions may here, for example, prevent the adhesive from flowing away from the corresponding emission field. Here and hereinafter, transparent means that the adhesive is, for example, transparent, in particular clear or predominantly transmissive, with a transparency of at least 80% or at least 90% to the light emitted by the emission fields. Here and hereinafter, lateral is a direction parallel to the major side of the semiconductor chip.

The transparent adhesive may be, for example, a silicone or an epoxide or a resin.

The layer thickness of the transparent adhesive perpendicular to the major side is preferably ≥3 µm or ≥5 µm or ≥10 µm.

Alternatively or in addition, the layer thickness of the transparent adhesive is ≤20 µm or ≤15 µm or ≤10 µm.

According to at least one embodiment, the conversion element is bonded to the emission field by means of the transparent adhesive. Both the semiconductor chip and the conversion element are here in direct contact with the transparent adhesive. The transparent adhesive thus ensures the mechanical connection between the emission field and the conversion element. Bonded means, for example, that predominantly or only molecular and/or atomic forces bring about the bond between conversion element and emission field. The bonded connection can only be undone by destroying the connecting means which has been used.

According to at least one embodiment, the conversion element takes the form of a self-supporting plate, for example, a ceramic plate. Within the bounds of manufacturing tolerances, the top and bottom of the plate here preferably extend in planar manner and/or parallel to one another along the entire lateral extent. The top and bottom may here comprise entirely intentionally or unintentionally introduced roughened portions or trenches. If, however, an equalization surface is laid through each of the top and bottom, these equalization surfaces extend in planar or level manner and/or parallel to one another.

According to at least one embodiment, the major side of the semiconductor chip is of planar and trench-free construction along the entire lateral extent of the semiconductor chip. The major side may here comprise production-related roughened portions or intentionally introduced roughened portions to improve radiation outcoupling. Planar means in this connection that an equalization surface laid through the major side is planar. Trench-free means that the major side comprises no recesses which are intentionally introduced into the semiconductor layer sequence of the semiconductor chip and the height or depth of which is ≥4 µm or ≥3 µm or ≥2 µm. In particular, no such trenches are arranged in the region between adjacent emission fields.

According to at least one embodiment, the major side of the semiconductor chip is formed of a single material along the entire lateral extent of the semiconductor chip. The material of the major side may be, for example, not only a semiconductor material of the semiconductor layer sequence present in the semiconductor chip, but also an electrode material, such as a transparent electrode material, for example, ITO.

According to at least one embodiment, the active layer of the semiconductor chip is of continuous and uninterrupted construction along the entire lateral extent of the semiconductor chip. This means in particular that the active layer is not interrupted between adjacent emission fields and/or in the region of the reflective partitions.

According to at least one embodiment, contact elements are arranged on the side of the semiconductor chip remote from the major side, which contact elements can be energized individually and mutually independently and are spaced or separated from one another. Each contact element is here preferably associated one-to-one with an emission field. As a result of energizing a contact element, the associated emission field is operated and couples out radiation. The lateral extent of the emission fields is here preferably determined by the lateral extent of the contact elements. Only in the region of the energized contact element does the active layer generate radiation, which is then coupled out via the emission field. The lateral extent of the contact elements or emission fields may here, for example, amount to at least 5 µm or at least 50 µm or at least 100 µm.

Alternatively or in addition, the lateral extent is ≤200 µm or ≤150 µm or ≤125 µm.

According to at least one embodiment, in the region of the covered emission field, the bottom of the conversion element does not project beyond the reflective partitions in a direction away from the major side. In other words, the highest point of the partitions surrounding the emission field is at a greater distance from the major side than the bottom of the conversion element in the region of the covered emission field.

According to at least one embodiment, the conversion element is in direct contact with the partitions and with the transparent adhesive.

The partitions may be adhesive and mechanically stably connect the conversion element to the semiconductor chip. In particular, in the case of adhesive partitions, it is also possible to dispense with the transparent adhesive, such that the region between conversion element and covered emission field is formed by a space which contains neither a transparent adhesive nor other materials. The mechanically stable connection between conversion element and partitions is then predominantly or exclusively achieved via the adhesive action of the partitions.

According to at least one embodiment, in plan view onto the major side, a plurality of emission fields and the partitions extending therebetween are partially or completely covered by a common, continuously and contiguously formed conversion element. The conversion element may here again be a plate, for example, a ceramic plate.

According to at least one embodiment, the common conversion element comprises trenches in the region of the partitions. In plan view onto the major side, the trenches then partially or completely overlap with the partitions. In particular, the trenches may together form a reticulate grid which corresponds to the reticulate grid of the reflective partitions. For example, in plan view, the emission field covered by the conversion element may be completely surrounded by a contiguous trench. The conversion element preferably comprises no trenches in the region of the emission fields.

The trenches extend, for example, from the top and/or bottom of the conversion element in the direction towards or away from the major side of the semiconductor chip into the conversion element and pass through the conversion element, for example, to an extent of at least 30% or at least 50% or at least 75%. Alternatively or in addition, the trenches pass through the conversion element to an extent of at most 95% or at most 90% or at most 85%. The trenches have, for example, a depth of at least 1 µm or at least 5 µm or at least 10 µm. Alternatively or in addition, the depth of the trenches is ≤80 µm or ≤60 µm or ≤20 µm. The maximum width of the trenches parallel to the major side is preferably greater than or less than or equal to the width of the partitions. The trenches in particular bring about an optical separation between one radiation-emitting emission field and an emission field adjacent thereto. This optical separation acts in addition to the optical separation which is achieved by the reflective partitions.

According to at least one embodiment, all the emission fields or a plurality of emission fields arranged in a group each comprise a dedicated conversion element which is associated one-to-one with the respective emission field. The conversion element may, for example, be arranged on and mechanically fastened to the emission field by means of the transparent adhesive. In plan view onto the major side, the conversion elements then solely cover the associated emission field, but no adjacent emission fields.

According to at least one embodiment, in the region of the partitions, the conversion elements of two adjacent emission fields are in each case laterally spaced from one another by a gap. This means in particular that the conversion elements of adjacent emission fields are not in direct contact with one another.

According to at least one embodiment, the transparent adhesive at least partially fills the gap between conversion elements of two adjacent emission fields. In the region of the gaps, the transparent adhesive however preferably does not project beyond the top of the conversion elements in the direction away from the major side.

According to at least one embodiment, the gap between conversion elements of adjacent emission fields is at least partially or completely filled in with a reflective material. The reflective material may be reflective and/or diffusely scattering for the primary radiation from the semiconductor chip or the secondary radiation emitted by the conversion element. In plan view onto the major side, each conversion element may then be partially or completely surrounded by a contiguous web of the reflective material. The reflective material here brings about additional optical separation of adjacent emission fields for an observer.

According to at least one embodiment, in the region of the covered emission fields, the partitions project beyond the conversion element or conversion elements in the direction away from the major side. In the region of the covered emission fields, the partitions may here project beyond the tops of the conversion elements, for example, by at least 2 µm or at least 5 µm or at least 10 µm. Alternatively or in addition, in the region of the covered emission fields, the partitions project beyond the tops of the conversion elements by at most 15 µm or at most 10 µm or at most 7 µm.

The partitions here preferably extend through the gap between two adjacent conversion elements and pass completely through this gap. The conversion elements are then in particular thus laterally bounded by the partitions.

According to at least one embodiment, the conversion element is a contiguous and continuous layer which form-fittingly covers a plurality of emission fields and the partitions located therebetween. In particular, the conversion element is here in direct contact with the major side of the semiconductor chip or with the partitions. Neither a gap nor an interspace relative to the conversion element is here preferably provided between the covered partitions and the covered emission fields.

According to at least one embodiment, the conversion element has a thickness transversely of the major side of at least 10 µm or at least 30 µm or at least 50 µm. Alternatively or in addition, the thickness of the conversion element is ≤150 µm or ≤100 µm or ≤70 µm.

Preferably, the thickness of the conversion element is between 10 µm and 15 µm inclusive or between 40 µm and 100 µm inclusive.

A method for producing an optoelectronic semiconductor component is additionally provided. The method is suitable in particular for producing an optoelectronic semiconductor component described here. In other words, all features disclosed in relation to the optoelectronic semiconductor component are also disclosed for the method and vice versa.

According to at least one embodiment, the method for producing an optoelectronic semiconductor component comprises a step A), in which a semiconductor chip with a major side is provided. The major side comprises a plurality of emission fields arranged adjacent one another which are individually and mutually independently drivable and via which, during operation, radiation is in each case coupled out of the semiconductor chip.

According to at least one embodiment, in a step B) the method involves applying reflective partitions onto the major side between adjacent emission fields, wherein in plan view onto the major side the emission fields are at least partially surrounded by the partitions. The partitions here project beyond the semiconductor chip in the direction away from the major side.

According to at least one embodiment, the method comprises a step C), in which after step B) a conversion element with a bottom facing the semiconductor chip and a top remote from the semiconductor chip is applied at least on an emission field, wherein after application, in the region of the corresponding emission field, the bottom of the conversion element projects beyond the reflective partitions in a direction away from the major side by at most 10% of the height of the partitions.

According to at least one embodiment, in the method a transparent adhesive is applied at least onto an emission field after step B) and before step C), wherein the transparent adhesive at least partially form-fittingly covers side walls of the partitions surrounding the emission field.

According to at least one embodiment, in step C) the conversion element is applied onto the emission field with the transparent adhesive. The conversion element is here preferably brought into direct contact with the adhesive, such that the conversion element is indirectly connected to the emission field via the transparent adhesive.

According to at least one embodiment, in a subsequent step the transparent adhesive is completely cured and, as a consequence, a bonded and mechanically stable connection between the conversion element and emission field is produced.

According to at least one embodiment, the reflective partitions are applied in the method by means of an aerosol jet method. Aerosol jet methods are printing methods in which an aerosol is sprayed via a print head onto a surface. Small structures in the micrometer or nanometer range may be printed in this manner. The reflective partitions printed in this manner preferably comprise a reflective adhesive. Such an adhesive may, for example, be a silicone adhesive or a resin or an epoxide.

According to at least one embodiment, after the printing method, the reflective partitions are partially but not completely cured. The partitions are here preferably partially cured to such an extent that the transparent adhesive can be applied without any intermixing of the partitions and the transparent adhesive occurring. The partially cured reflective partitions should also not be deformed or destroyed by application of the transparent adhesive.

According to at least one embodiment, the conversion element is applied onto the semiconductor chip in such a manner that the conversion element is in direct contact both with the transparent adhesive and with the reflective partitions.

According to at least one embodiment, in a subsequent step, the transparent adhesive and the reflective partitions are fully and completely cured, whereby the conversion element is bonded to the semiconductor chip. Bonding of the conversion element to the semiconductor chip may also be brought about solely by the reflective partitions, wherein it is then possible to dispense with a transparent adhesive on the emission fields.

According to at least one embodiment, the reflective partitions are applied to the semiconductor chip by means of a lithography process. To this end, for example, a photoresist layer on the semiconductor chip is covered by means of a patterned mask, the photoresist is then exposed to light and completely cured and the incompletely cured parts of the photoresist layer are removed again, such that only the reflective partitions remain.

According to at least one embodiment, once the reflective partitions have been produced, the transparent adhesive is applied onto the major side of the semiconductor chip by means of a doctor blade process. By means of the doctor blade process, the regions between the reflective partitions are then partially or completely filled in with the transparent adhesive.

According to at least one embodiment, the conversion element is applied form-fittingly onto the partitions and emission fields by means of a spraying method. In this case, an additional transparent adhesive for the connection between conversion element and emission fields is unnecessary.

BRIEF DESCRIPTION OF THE DRAWINGS

An optoelectronic semiconductor component described here and a method for producing an optoelectronic semiconductor component are explained in greater detail below on the basis of exemplary embodiments and with reference to drawings. Elements which are the same in the individual figures are indicated with the same reference numerals. The relationships between the elements are not shown to scale, however, but rather individual elements may be shown exaggeratedly large to assist in understanding.

In the figures:

FIGS. 1D to 3B show side views of exemplary embodiments of an optoelectronic semiconductor component;

DETAILED DESCRIPTION OF ILLUSTRATIVE EMBODIMENTS

Figure 1A:
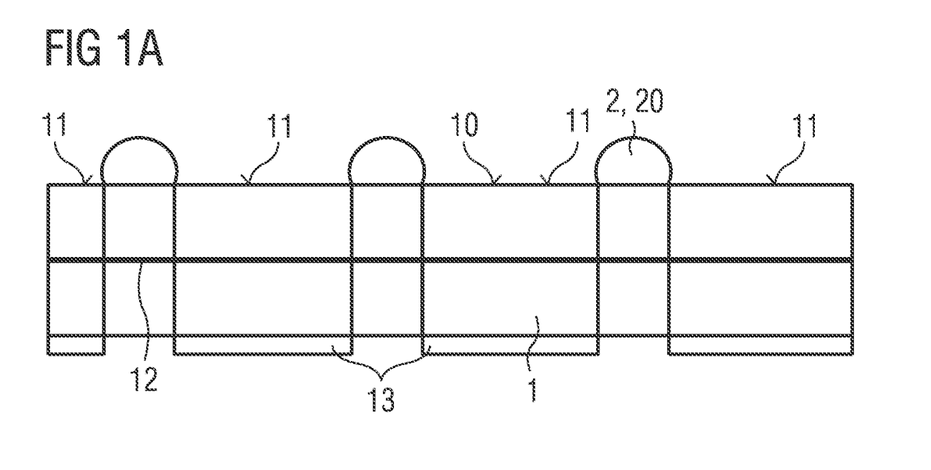
FIGS. 1A to 1C show side and plan views of exemplary embodiments of an optoelectronic semiconductor component during production.

FIG. 1A shows an optoelectronic semiconductor chip 1 with a planar and flat major side 10, which, for example, forms a radiation outcoupling face of the semiconductor chip 1. The major side 10 is formed along the entire lateral extent from a single material, for example, from a passivator, and does not comprise any intentionally introduced trenches. The semiconductor chip 1 further comprises a semiconductor layer sequence, for example, of AlInGaN, with an active layer 12, in which electromagnetic radiation is generated during operation.

Contact elements 13 are arranged on a bottom, opposite the major side 10, of the semiconductor chip 1. The contact elements 13 are, for example, formed from a metal, such as Ag, or a transparent conductive oxide, such as ITO. The contact elements are here in direct contact with the semiconductor layer sequence. The semiconductor layer sequence of the semiconductor chip 1 may be energized via the contact elements 13. The contact elements 13 are separated and spaced from one another.

An emission field 11 is associated one-to-one with each of the contact elements 13 on the major side 10 of the semiconductor chip 1. On energization of a contact element 13, radiation is generated in the active layer 12 in the region of the contact element 13, which radiation then emerges from the semiconductor chip 1 via the associated emission field 11. The lateral extent of the contact elements 13 here defines the lateral extent of the emission fields 11 and amounts, for example, to between 5 µm and 125 µm.

In the lateral direction between the individual contact elements 13, the semiconductor layer sequence comprises interspaces which cannot be driven and in which, when the semiconductor chip 1 is in operation, the active layer 12 generates no or only little electromagnetic radiation. The interspaces have, for example, a width parallel to the major side 10 of between 5 µm and 20 µm. The interspaces are shown as white strips in FIG. 1A.

In FIG. 1A, reflective partitions 20 are arranged on the major side 10 in the lateral direction between two adjacent emission fields 11. The partitions 20 here project beyond the semiconductor chip 1 in a direction away from the major side 10 and have, for example, a height of between 5 µm and 20 µm. The partitions 20 are here arranged in the region of the interspaces and partially or completely cover the interspaces in plan view onto the major side. Preferably, no or only little electromagnetic radiation is thus generated in the semiconductor layer sequence beneath the partitions 20.

The partitions 20 consist in the present case, for example, of a silicone or epoxide or resin which is provided with radiation-reflecting particles such as titanium dioxide particles.

Figure 1B:
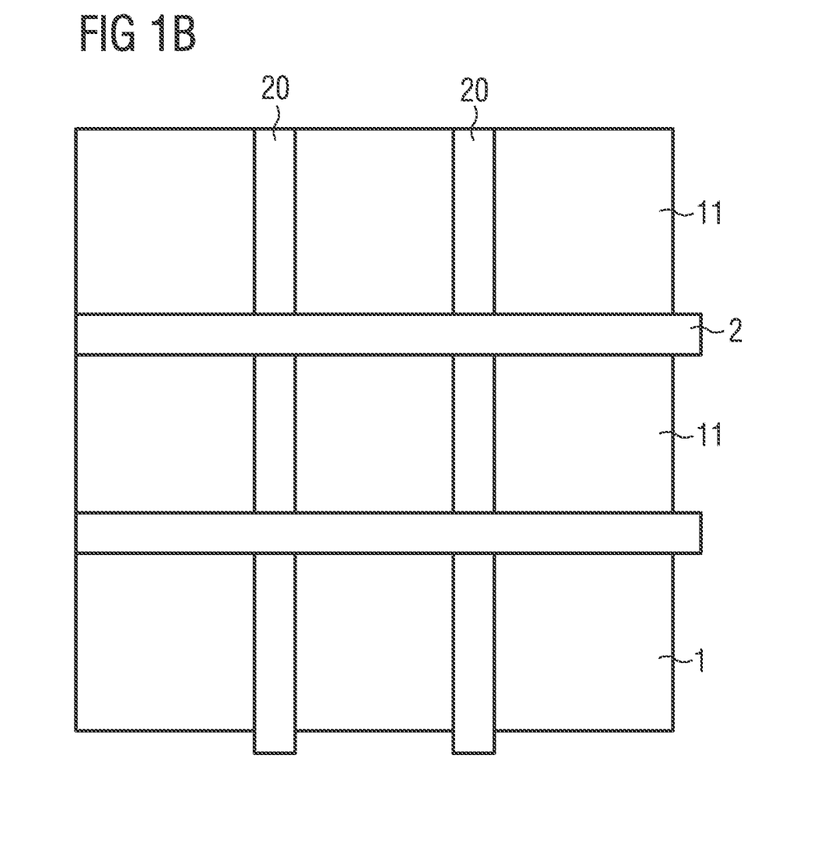

FIG. 1B shows the semiconductor chip 1 with the applied reflective partitions 20 in plan view onto the major side 10. It may be seen that the partitions 20 together form a reflective grid 2, wherein the emission fields 11 of the semiconductor chip 1 are arranged in the manner of a matrix in meshes of the reflective grid 2, wherein each emission field 11 is associated one-to-one with a mesh of the reflective grid 2. Each emission field 11 is thus at least partially surrounded by partitions 20. The partitions 20 provide an observer looking at the major side 10 with improved optical separation between an emission field 11 which is in operation and an emission field 11 adjacent thereto. Operation of an emission field 11 is controlled by the associated contact element 13 being energized.

Figure 1C:
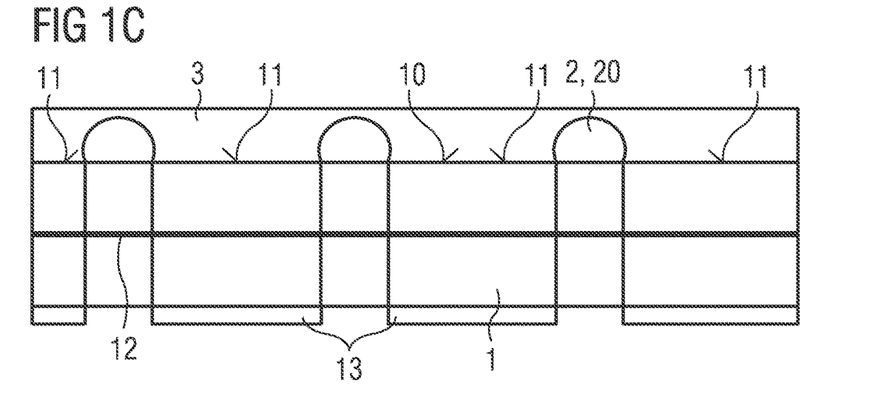

FIG. 1C shows an exemplary embodiment in side view in which a transparent, in particular clear, adhesive 3 is applied onto the major side 10 of the semiconductor chip 1. The transparent adhesive 3 is, for example, a silicone adhesive. The transparent adhesive 3 is applied as a contiguous and uninterrupted layer over the entire area of a plurality of emission fields 11 and, in so doing, covers the reflective partitions 20 located between the emission fields 11. The average thickness of the adhesive layer is here greater than the height of the partitions 20. The adhesive 3 covers the partitions 20 and the emission fields 11 form-fittingly, such that no gap or space is formed between the transparent adhesive 3 and the partitions 20 or emission fields 11.

Figure 1D:
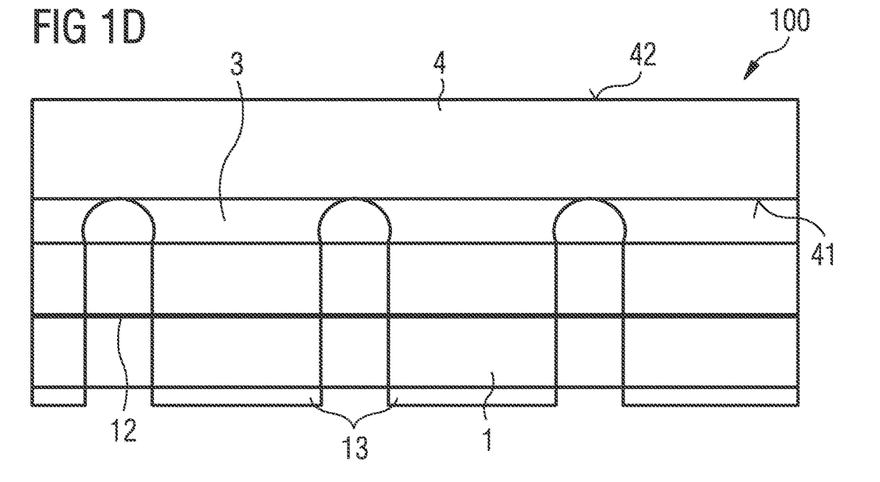

The exemplary embodiment of FIG. 1D shows a finished optoelectronic semiconductor component 100. A conversion element 4 has been applied onto the major side 10 of the semiconductor chip 1. In plan view onto the major side 10, the conversion element 4 here completely covers a plurality of emission fields 11 and the partitions 20 located therebetween. The conversion element 4 is preferably a plate with a top 42 and a bottom 41, wherein the top 42 and bottom 41 extend substantially parallel to one another. The conversion element 4 is of continuous, contiguous and uninterrupted construction.

The conversion element 4 of FIG. 1D is, for example, self-supporting and does not need the semiconductor chip 1 for mechanical stabilization. The element has, for example, a thickness of between 40 µm and 100 µm inclusive. The conversion element 4 is furthermore pressed so strongly onto the semiconductor chip 1 that it is in direct contact with the reflective partitions 20 and the transparent adhesive 3. In the region of the emission fields 11, the bottom 41 of the conversion element 3 thus does not project beyond the partitions 20 in the direction away from the major side 10.

Alternatively, the conversion element 4 of FIG. 1D may also be applied with the assistance of a carrier, wherein the carrier is detached after application of the conversion element 4. The conversion element 4 is then, for example, of a thickness of between 10 µm and 15 µm inclusive and is, for example, not self-supporting.

The conversion element 4 is, for example, a ceramic conversion element 4 made from a luminescent material, such as a YAG. The conversion element 4 is, for example, configured to convert UV radiation or blue radiation into red or green or yellow light.

The conversion element 4 of FIG. 1D is mechanically bonded to the semiconductor chip 1 by means of the transparent adhesive 3. The conversion element 4 may here only be detached by destroying or breaking the transparent adhesive 3. It is additionally possible for the reflective partitions 20 also to be adhesive and additionally or alone to bring about the bonded mechanically stable connection between the semiconductor chip 1 and the conversion element 4.

In FIG. 1D, all the emission fields 11 of the semiconductor chip 1 are completely covered by the common conversion element 4. In plan view onto the major side 10, the conversion element 4 completely covers the entire semiconductor chip 1 and projects beyond the latter in all lateral directions. Alternatively, the conversion element 4 may also terminate flush in the lateral direction with side faces of the semiconductor chip 1.

Figure 2:
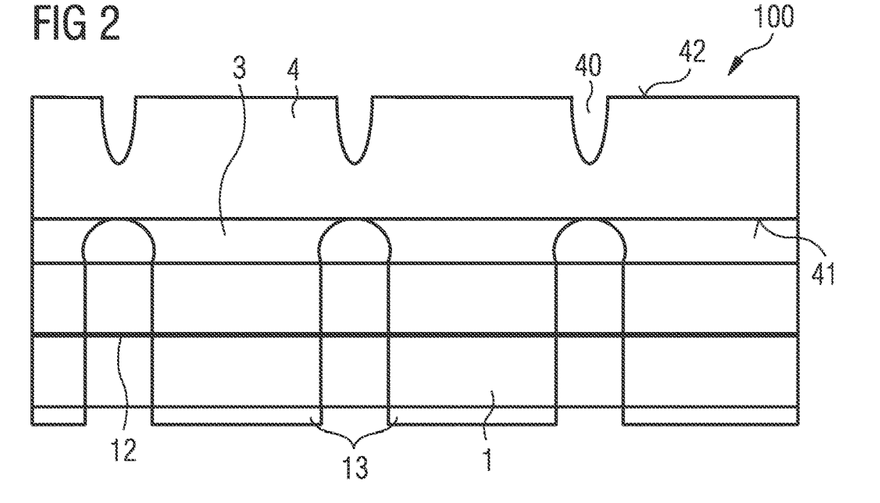

In the exemplary embodiment of FIG. 2, unlike in FIG. 1D, the conversion element 4 comprises additional trenches 40 which extend from the top 42 of the conversion element 4 towards the bottom 41. The trenches 40 pass through the conversion element 4, for example, to an extent of at least 55% and at most 85%. The trenches 40 are furthermore arranged in the region of the reflective partitions 20, such that, in plan view onto the major side 10, the trenches 40 partially or completely overlap with the reflective partitions 20. The conversion element 4 of FIG. 2 may be self-supporting.

The trenches 40 in the conversion element 4, in addition to the reflective partitions 20, bring about optical separation between adjacent emission fields 11. Some of the light passing through the conversion element 4 is totally reflected at the side faces of the trenches 40, so suppressing crosstalk of the light emitted by two adjacent emission fields 11. For an observer looking onto the top 42 of the conversion element 4, the emission field 11 in operation then appears to be optically separated from an adjacent emission field 11.

The trenches 40, for example, have the same grid-like structure as the reflective partitions 20. A pixelated semiconductor component 100 is obtained in this way.

Figure 3A:
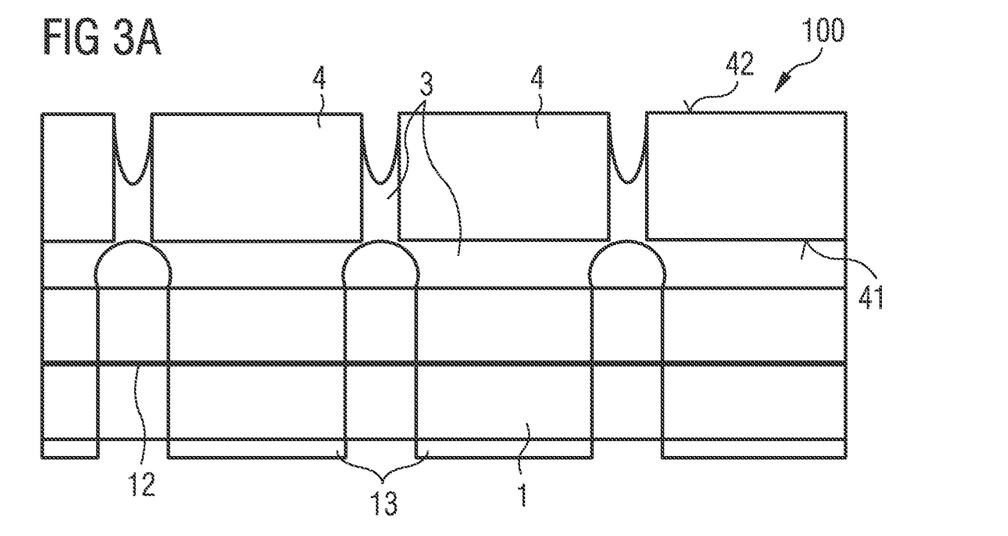

The exemplary embodiment of FIG. 3A shows an optoelectronic semiconductor component 100, in which a plurality of emission fields 11 are in each case covered by a dedicated conversion element 4 which is associated one-to-one therewith. In plan view onto the major side 10, each conversion element 4 here partially or completely covers only the associated emission field 11, but not adjacent emission fields 11. Furthermore, the conversion elements 4 at least partially cover the partitions 20 located between the emission fields 11. Each conversion element 4 may again take the form of a self-supporting, for example, ceramic, plate. A gap 43 is in each case arranged between two adjacent conversion elements 4 of two adjacent emission fields 11. The gap 43 here separates two adjacent conversion elements 4 from one another. In plan view onto the major side 10, the gaps 43 at least partially overlap with the reflective partitions 20. The gaps 43 are furthermore at least partially filled in with the transparent adhesive 3. In the present case, the transparent adhesive 3 at least half fills the gaps 43.

Figure 3B:
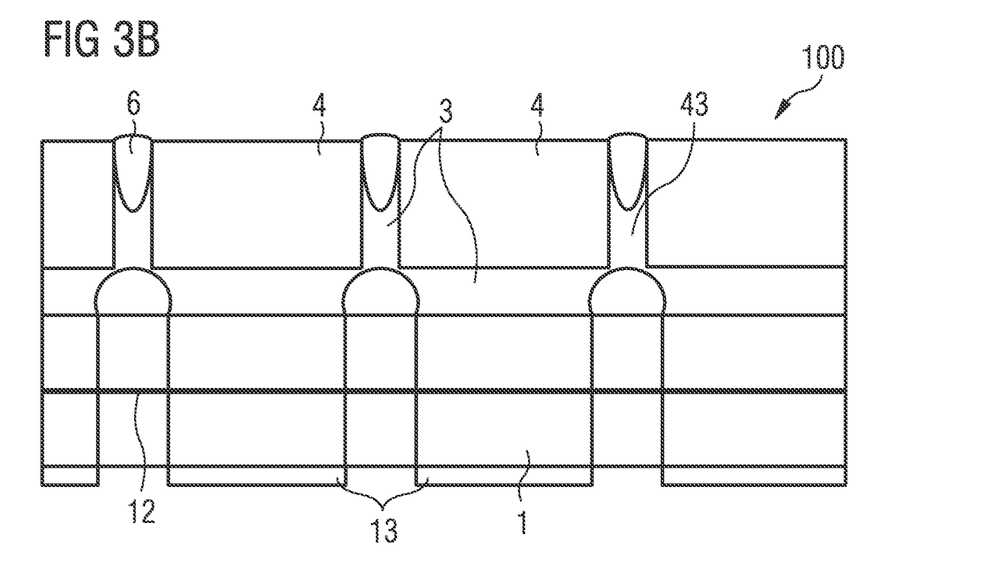

The exemplary embodiment of FIG. 3B shows the same optoelectronic semiconductor component 100 as in FIG. 3A. In addition, a reflective material 6 is also introduced into the gaps 43 in the exemplary embodiment of FIG. 3B. This may be the same reflective material as the material of the reflective partitions 20 or another material. In the present case, the gaps 43 are completely filled in with the transparent adhesive 3 and the reflective material 6, such that the reflective material 6 partially projects beyond the conversion elements 4 in the direction away from the major side 10. In plan view onto the optoelectronic semiconductor component 100, each conversion element 4 is, for example, partially or completely surrounded by a continuous and contiguous web of the reflective material 6.

Figure 4A:
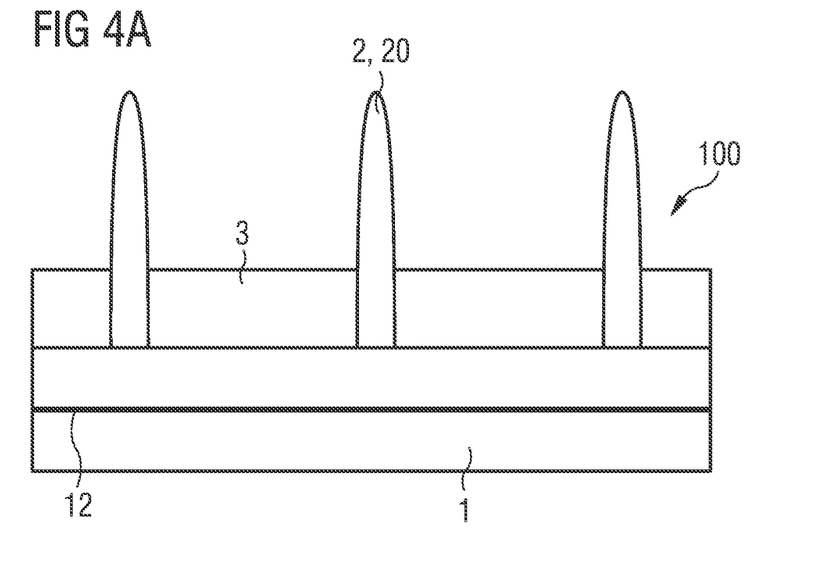
FIGS. 4A to 4C show side views of an optoelectronic semiconductor component during the production process.

FIG. 4A shows a method step for producing an optoelectronic semiconductor component 100 in side view. FIG. 4A is here similar to the exemplary embodiment of FIG. 1C. The partitions 20 in FIG. 4A are, however, higher than in FIG. 1B, for example, the partitions 20 have a height of at least 10 µm and at most 20 µm. In the exemplary embodiment of FIG. 4A, the transparent adhesive 3 is also arranged solely in the region of the emission fields 11, but does not cover the reflective partitions 20. Instead, the transparent adhesive 3 partially fills in the region between two adjacent reflective partitions 20. The height of the layer of the transparent adhesive 3 is here less than half the height of the reflective partitions 20.

Figure 4B:
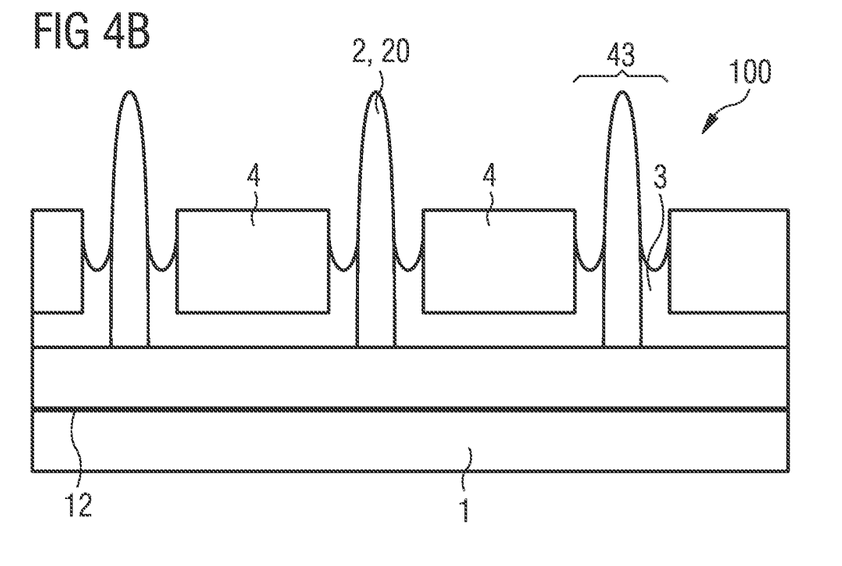

FIG. 4B shows the finished optoelectronic semiconductor component 100 after application of conversion elements 4. As in FIG. 3A, a dedicated conversion element 4 associated one-to-one with each emission field 11 is applied. The conversion elements 4 are arranged between the reflective partitions 20 and are laterally bounded thereby. Furthermore, in the region of the emission fields 11, the reflective partitions 20 project beyond the top 42 of the conversion elements 4 in the direction away from the major side 10, for example, by at least 2 µm or 5 µm or 10 µm. The reflective partitions 20 here penetrate the gaps 43 between two adjacent conversion elements 4. The gaps 43 are furthermore at least partially filled in with the transparent adhesive 3. The lateral extent of the conversion element 4 is thus smaller than the distance between opposing partitions 20.

Figure 4C:
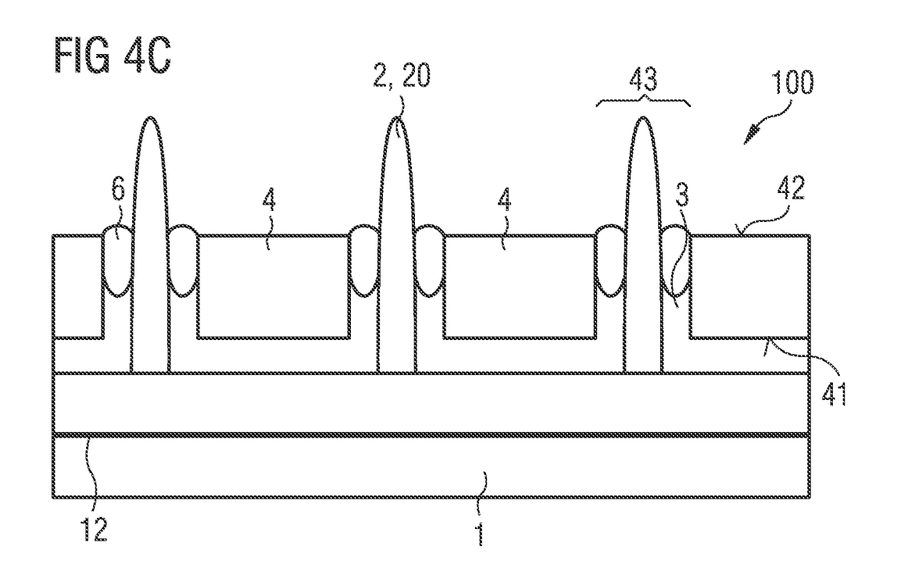

The exemplary embodiment of FIG. 4C shows an optoelectronic semiconductor component 100 with the same characteristics as in FIG. 4B. In addition, however, in FIG. 4C the region of the gaps 43 between adjacent conversion elements 4 which is not filled in with the transparent adhesive 3 or the reflective partitions 20 is filled with an additional reflective material 6. The gaps 43 between the conversion elements 4 are here completely filled in by the reflective material 6, the transparent adhesive 3 and the reflective partitions 20.

Figure 5:
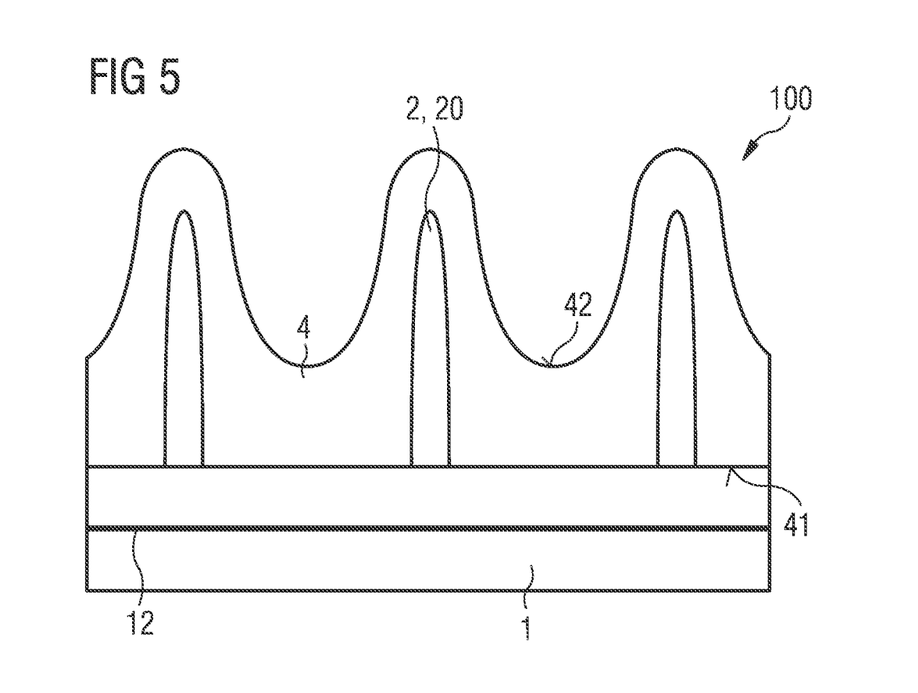
FIG. 5 shows an optoelectronic semiconductor component in side view.

In the exemplary embodiment of FIG. 5, the conversion elements 4 are not applied onto the partitions 20 or the semiconductor chips 1 by means of an adhesive, but are instead applied as a continuous and contiguous layer without interruptions. The conversion element 4 may here be applied, for example, by means of a spraying method onto the emission fields 11 and the partitions 20. The conversion element 4 applied in this manner form-fittingly and completely covers both the partitions 20 and the emission fields 11.

In particular, in this manner a plurality of emission fields 11 and partitions 20 are covered by a single conversion element 4.

The description made with reference to exemplary embodiments does not restrict the invention to these embodiments. Rather, the invention encompasses any novel feature and any combination of features, including in particular any combination of features in the claims, even if these features or this combination is not itself explicitly indicated in the claims or exemplary embodiments.

The invention claimed is:

1. An optoelectronic semiconductor component comprising:
   a semiconductor chip with a major side, wherein the major side comprises a plurality of emission fields arranged adjacent one another, wherein the emission fields are individually and mutually independently drivable, and wherein each emission field is configured to emit radiation from the semiconductor chip;
   reflective partitions arranged at the major side and in direct contact with the major side, wherein the partitions are arranged between adjacent emission fields and, in plan view onto the major side, at least partially surround the emission fields; and
   at least one conversion element arranged at the major side, the conversion element facing the semiconductor chip with a bottom side and having a top side remote from the semiconductor chip,
   wherein the partitions comprise a material which differs from a semiconductor material of the semiconductor chip,
   wherein the partitions project beyond the semiconductor chip in a direction away from the major side,
   wherein the conversion element at least partially covers at least one emission field and is mechanically stably connected to this emission field, and
   wherein, in a region of the covered emission field, the bottom side of the conversion element projects beyond the partitions in a direction away from the major side by at most 10% of a height of the partitions,
   wherein a plurality of emission fields and the partitions extending therebetween are covered by a common, continuously and contiguously formed conversion element,
   wherein, in regions of the partitions, the common conversion element comprises trenches which extend from at least one of the top side or the bottom side of the conversion element in a direction towards or away, respectively, from the major side and into the conversion element, and
   wherein the trenches provide optical separation between one emission field and an adjacent emission field.

2. The optoelectronic semiconductor component according to claim 1, further comprising a transparent adhesive which is applied at least to one of the emission fields and which at least partially form-fittingly covers side walls of the reflective partitions surrounding the emission field, wherein the conversion element is bonded to the emission field by the transparent adhesive, and wherein the conversion element takes the form of a self-supporting plate, the top and bottom sides of which, within bounds of manufacturing tolerances, are planar and extend parallel to one another.

3. The optoelectronic semiconductor component according to claim 2, wherein, in the region of the covered emission field, the bottom side of the conversion element does not project beyond the reflective partitions in a direction away from the major side, and wherein the conversion element is in direct contact with the partitions and the transparent adhesive.

4. The optoelectronic semiconductor component according to claim 2, wherein each emission field comprises a dedicated conversion element, wherein each conversion element is associated one-to-one with an emission field and is arranged on the emission field by the transparent adhesive, wherein, in a region of a partition of two adjacent emission fields, each conversion element is laterally spaced from another conversion element by a gap.

5. The optoelectronic semiconductor component according to claim 4, wherein the transparent adhesive at least partially fills the gap, and wherein the gap is at least partially filled with a reflective material.

6. The optoelectronic semiconductor component according to claim 4, wherein the partitions project beyond the conversion elements in a direction away from the major side for each covered emission field, and wherein the partitions extend through the gap between two adjacent conversion elements in each case.

7. The optoelectronic semiconductor component according to claim 2, wherein the reflective partitions comprise an epoxide, resin or silicone with $TiO_2$ particles, and wherein the transparent adhesive comprises a silicone adhesive.

8. The optoelectronic semiconductor component according to claim 1,
   wherein the major side of the semiconductor chip is planar and trench-free along an entire lateral extent of the semiconductor chip,
   wherein an active layer of the semiconductor chip extends continuously and uninterruptedly along the entire lateral extent of the semiconductor chip, and
   wherein the emission fields are individually and mutually independently drivable by energization of separate contact elements associated one-to-one therewith, wherein the contact elements are arranged to a side of the semiconductor chip remote from the major side.

9. The optoelectronic semiconductor component according to claim 1, wherein the conversion element is a contiguously and continuously formed layer which form-fittingly covers the plurality of emission fields and the partitions located therebetween and is in direct contact with the major side and the partitions.

10. The optoelectronic semiconductor component according to claim 1, wherein the partitions have a height of between 5 μm and 10 μm, and wherein the conversion element has a thickness of at least 10 μm.

11. A method for producing an optoelectronic semiconductor component, the method comprising:
   A) providing a semiconductor chip with a major side, wherein the major side comprises a plurality of emission fields arranged adjacent one another which are individually and mutually independently drivable and via which, during operation, radiation is in each case coupled out of the semiconductor chip;
   B) applying reflective partitions onto the major side between adjacent emission fields, wherein, in plan view onto the major side, the emission fields are at least partially surrounded by the partitions, wherein the partitions are formed from a material which differs from a semiconductor material of the semiconductor chip, and wherein the partitions project beyond the semiconductor chip in a direction away from the major side; and C) subsequently applying at least one conversion element with a bottom side facing the semiconductor chip and a top side remote from the semiconductor chip at least on an emission field, wherein, after applying the at least one conversion element, in a region of the corresponding emission field, the bottom side of the conversion element projects beyond the reflective partitions in a direction away from the major side by at most 10% of a height of the partitions, wherein the conversion element is bonded to the emission fields a transparent adhesive located between the major side and the conversion element, wherein, after applying the at least one conversion element, a plurality of emission fields and the partitions extending therebetween are covered by a common, continuously and contiguousl formed conversion element, wherein, in regions of the partitions, the common conversion element comprises trenches which extend from at least one of the top side or the bottom side of the conversion element in a direction towards or away, respectively, from the major side and into the conversion element, and wherein the trenches provide optical separation between one emission field and an adjacent emission field.

12. The method according to claim 11, further comprising:

after step B) and before step C), applying the transparent adhesive at least on the emission field, wherein the transparent adhesive at least partially form-fittingly covers side walls of the partitions surrounding the emission field, wherein, in step C), the conversion element is applied on the emission field with the transparent adhesive; and after step C), completely curing the transparent adhesive is and producing a bonded connection between conversion element and emission field.

13. The method according to claim 12, wherein the reflective partitions are applied by an aerosol jet method, wherein the reflective partitions comprise a reflective adhesive, wherein, afterwards, the reflective partitions are partially but not completely cured, wherein the conversion element is applied onto the semiconductor chip such that the conversion element is in direct contact with both the transparent adhesive and the reflective partitions, wherein, afterwards, the transparent adhesive and the reflective partitions are completely cured so that the conversion element is bonded to the semiconductor chip.

14. The method according to claim 12, wherein the reflective partitions are applied to the semiconductor chip by a lithography process, wherein, after complete curing of the reflective partitions, the transparent adhesive is applied to the major side of the semiconductor chip by a doctor blade process.

15. An optoelectronic semiconductor component comprising:

a semiconductor chip with a major side, wherein the major side comprises a plurality of emission fields arranged adjacent one another, wherein the emission fields are individually and mutually independently drivable, and wherein each emission field is configured to emit radiation from the semiconductor chip;

reflective partitions arranged on the major side and in direct contact with the major side, wherein the partitions are arranged between adjacent emission fields and, in plan view on the major side, at least partially surround the emission fields; and at least one conversion element arranged on the major side such that a bottom side faces the semiconductor chip and a top side is remote from the semiconductor chip, wherein the partitions comprise a material which differs from the semiconductor material of the semiconductor chip, wherein the partitions project beyond the semiconductor chip in a direction away from the major side, wherein the conversion element at least partially covers at least one emission field and is mechanically stably connected to this emission field, wherein, in a region of the covered emission field, the bottom side of the conversion element projects beyond the partitions in a direction away from the major side by at most 10% of a height of the partitions, and wherein the conversion element is bonded to the emission fields by a transparent adhesive located between the major side and the conversion element, wherein the major side of the semiconductor chip is planar and trench-free along an entire lateral extent of the semiconductor chip, wherein an active layer of the semiconductor chip extends continuously and uninterruptedly along the entire lateral extent of the semiconductor chip so that the active layer is uninterrupted at least one of between adjacent emission fields or in the region of the reflective partitions, and wherein the emission fields are individually and mutually independently drivable by energization of separate contact elements associated one-to-one therewith, and wherein the contact elements are arranged on a side of the semiconductor chip remote from the major side.

* * * * *

UNITED STATES PATENT AND TRADEMARK OFFICE
CERTIFICATE OF CORRECTION

PATENT NO. : 10,586,827 B2
APPLICATION NO. : 15/533025
DATED : March 10, 2020
INVENTOR(S) : Göötz et al.

Page 1 of 1

It is certified that error appears in the above-identified patent and that said Letters Patent is hereby corrected as shown below:

On the Title Page

Item (73) Assignee, Lines 1-2, delete "OSRAM OPTO SEMICONDUCTORS GMBH" and insert --OSRAM OLED GMBH--.

In the Claims

In Column 14, Line 14, Claim 4, delete "each emission field" and insert --each emission field of a plurality of other emissions fields--.

In Column 14, Lines 15-16, Claim 4, delete "each conversion element" and insert --each dedicated conversion element--.

In Column 14, Line 16, Claim 4, delete "an emission field" and insert --an emission field of the plurality of the other emissions fields--.

In Column 14, Line 17, Claim 4, delete "arranged on the emission field" and insert --arranged on the respective emission field--.

In Column 15, Lines 18-19, Claim 11, delete "the emission fields a transparent adhesive" and insert --the emission fields by a transparent adhesive--.

In Column 15, Line 24, Claim 11, delete "contiguousl" and insert --contiguously--.

In Column 15, Line 44, Claim 12, delete "is".

Signed and Sealed this
Eleventh Day of August, 2020

Andrei Iancu
*Director of the United States Patent and Trademark Office*